US012701939B2

(12) United States Patent
Mao et al.

(10) Patent No.: US 12,701,939 B2
(45) Date of Patent: Aug. 4, 2026

(54) SEMICONDUCTOR PACKAGES AND METHODS OF MANUFACTURING THEREOF

(71) Applicant: Taiwan Semiconductor Manufacturing Company, Ltd., Hsinchu (TW)

(72) Inventors: Lung-Kai Mao, Kaohsiung City (TW); Wen-Hsiung Lu, Tainan City (TW); Pei-Wei Lee, Pingtung County (TW); Szu-Hsien Lee, Tainan City (TW); Chieh-Ning Feng, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 780 days.

(21) Appl. No.: 18/169,573

(22) Filed: Feb. 15, 2023

(65) Prior Publication Data

US 2024/0120207 A1 Apr. 11, 2024

Related U.S. Application Data

(60) Provisional application No. 63/414,745, filed on Oct. 10, 2022.

(51) Int. Cl.
H10P 50/24 (2026.01)
H10P 50/28 (2026.01)
(Continued)

(52) U.S. Cl.
CPC .......... H10P 50/244 (2026.01); H10P 50/287 (2026.01); H10W 70/68 (2026.01);
(Continued)

(58) Field of Classification Search
CPC ................................................ H01L 21/30655
See application file for complete search history.

(56) References Cited

U.S. PATENT DOCUMENTS

2012/0228681 A1 9/2012 Lin et al.
2012/0280389 A1 11/2012 Liu et al.
(Continued)

FOREIGN PATENT DOCUMENTS

CN 102365744 A 2/2012
CN 107161944 A 9/2017
(Continued)

OTHER PUBLICATIONS

Office Action issued in connection with Taiwan Appl. No. 112124624 dated Feb. 21, 2024.
(Continued)

*Primary Examiner* — William A Harriston
(74) *Attorney, Agent, or Firm* — Foley & Lardner LLP

(57) ABSTRACT

A semiconductor package includes a die having a plurality of devices over a first substrate, where the first substrate includes a dopant at a first concentration and the first substrate has a first width along a horizontal direction. The semiconductor package further includes a second substrate fused with the first substrate, where the second substrate includes the dopant at a second concentration greater than the first concentration. The second substrate has a second width along the horizontal direction, where the second width is greater than the first width.

20 Claims, 13 Drawing Sheets

(51) Int. Cl.

| | |
|---|---|
| *H10W 70/68* | (2026.01) |
| *H10W 70/698* | (2026.01) |
| *H10W 72/29* | (2026.01) |
| *H10W 72/90* | (2026.01) |
| *H10W 72/00* | (2026.01) |
| *H10W 72/20* | (2026.01) |
| *H10W 90/00* | (2026.01) |

(52) U.S. Cl.
CPC .... *H10W 70/698* (2026.01); *H10W 72/01204* (2026.01); *H10W 72/01353* (2026.01); *H10W 72/0198* (2026.01); *H10W 72/073* (2026.01); *H10W 72/07331* (2026.01); *H10W 72/252* (2026.01); *H10W 72/29* (2026.01); *H10W 72/952* (2026.01); *H10W 90/731* (2026.01)

(56) References Cited

U.S. PATENT DOCUMENTS

| | | |
|---|---|---|
| 2020/0366050 A1 | 11/2020 | McLaurin et al. |
| 2021/0118734 A1* | 4/2021 | Hong .................... H10P 54/00 |
| 2022/0302296 A1 | 9/2022 | Zhang et al. |

FOREIGN PATENT DOCUMENTS

| | | |
|---|---|---|
| CN | 114586175 A | 6/2022 |
| EP | 1 134 809 A2 | 9/2001 |
| WO | WO-2013/077619 A1 | 5/2013 |

OTHER PUBLICATIONS

Office Action issued in Chinese Appl. No. 202310557122.X dated May 14, 2026.

* cited by examiner

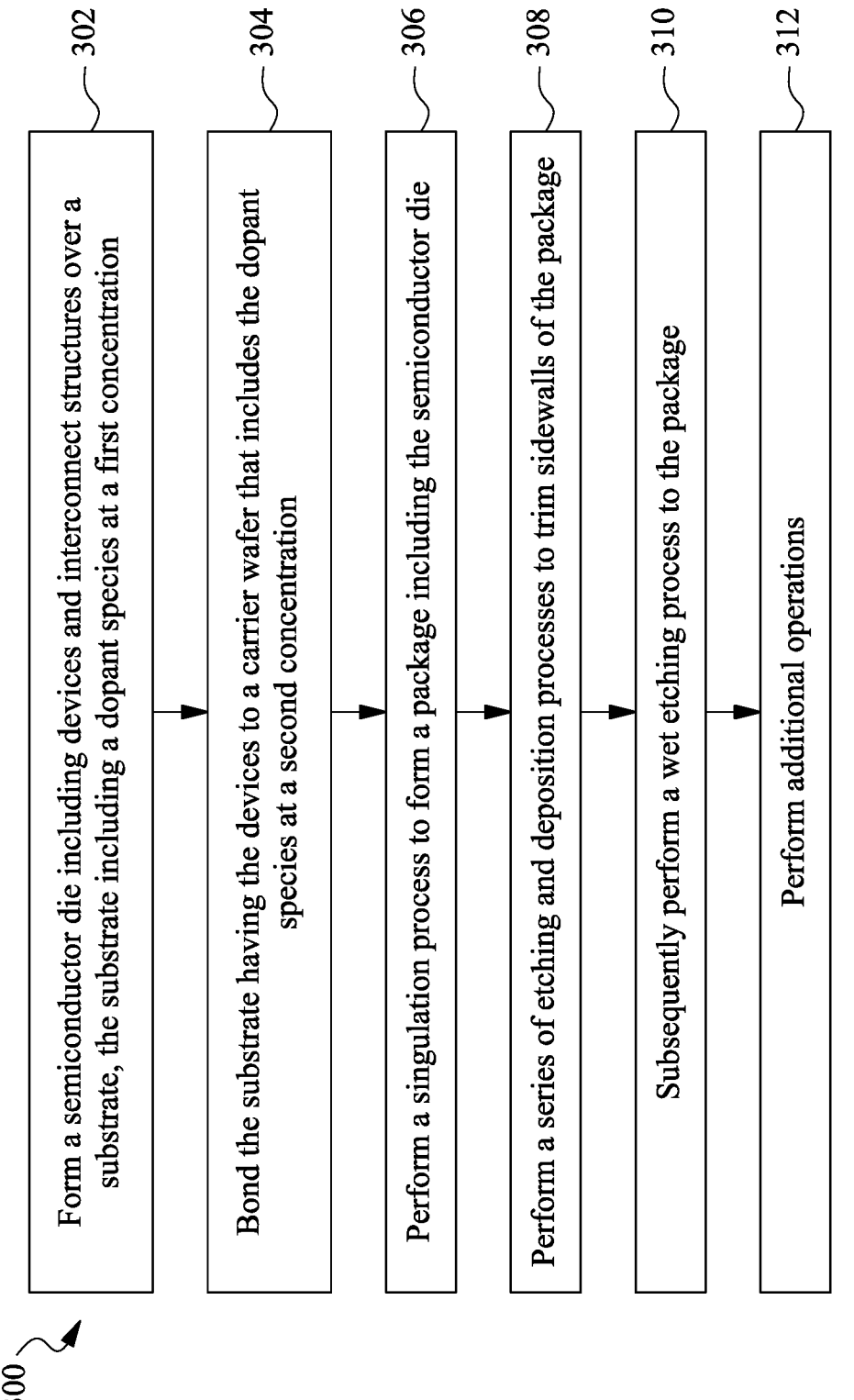

Form a semiconductor die including devices and interconnect structures over a substrate, the substrate including a dopant species at a first concentration — 302

Bond the substrate having the devices to a carrier wafer that includes the dopant species at a second concentration — 304

Perform a singulation process to form a package including the semiconductor die — 306

Perform a series of etching and deposition processes to trim sidewalls of the package — 308

Subsequently perform a wet etching process to the package — 310

Perform additional operations — 312

SEMICONDUCTOR PACKAGES AND METHODS OF MANUFACTURING THEREOF

CROSS-REFERENCE TO RELATED APPLICATIONS

This application claims priority to and the benefit of U.S. Provisional Patent App. No. 63/414,745, filed Oct. 10, 2022, the entire disclosure of which is incorporated herein by reference.

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-nanometer node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B are each an example flow chart of a method for fabricating a semiconductor package, in accordance with some embodiments.

FIGS. 4A, 4B, 4C-1, 4D, 4E, 4F, 4G, 4H, 4I, 4J, 4K, 4L, and 4M are cross-sectional views of at least a portion of the example semiconductor package of FIG. 2, in accordance with some embodiments.

FIG. 4C-2 is a planar top view of at least a portion of the example semiconductor package of FIG. 4C-1, in accordance with some embodiments.

DETAILED DESCRIPTION

Figure 1:
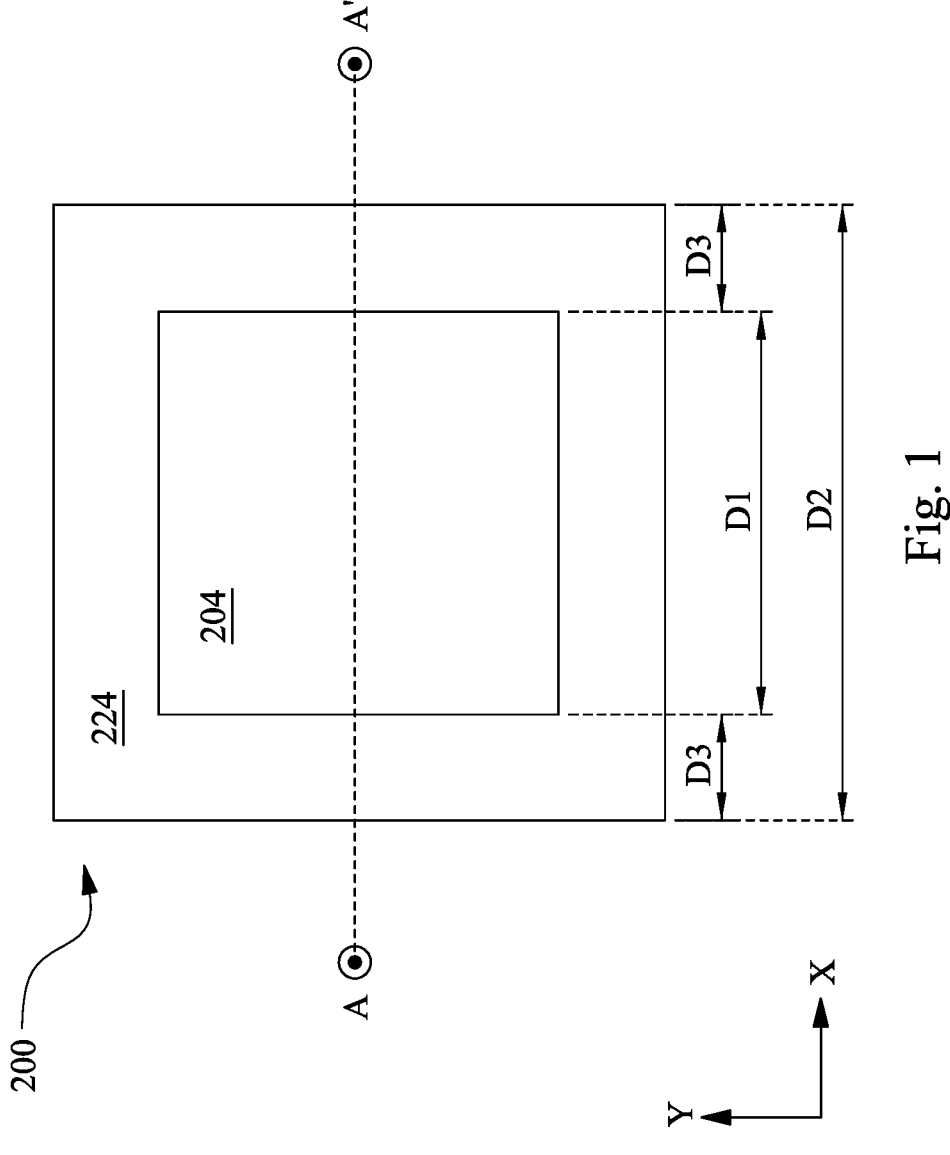
FIG. 1 illustrates a planar top view of a schematic diagram of an example semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the terms "about" and "approximately" generally mean plus or minus 10% of the stated value. For example, about 0.5 would include 0.45 and 0.55, about 10 would include 9 to 11, about 1000 would include 900 to 1100.

As semiconductor technologies further advance, packaged semiconductor devices, e.g., three-dimensional integrated circuits (3DICs), have emerged as an effective alternative to further reduce the physical size of semiconductor devices. In a packaged (e.g., stacked) semiconductor device, active circuits such as logic, memory, processor circuits, and the like are fabricated on different semiconductor wafers or dies. In some embodiments of the present disclosure, the packaged semiconductor device or a component thereof includes one or more micro-electromechanical systems (MEMS). Two or more these semiconductor dies may be placed side-by-side or stacked on top of one another to further reduce the form factor of the semiconductor device.

While various aspects of performance (e.g., electrical performance) of a semiconductor package can be significantly improved, other issues may arise. For example, implementing isotropic etching processes to remove certain components from the semiconductor package may inadvertently cause structural defects and potential failure of the substrate(s) of the semiconductor package under mechanical stress. Thus, improvements in the existing semiconductor packages and methods of fabricating the same are desired.

Figure 2:
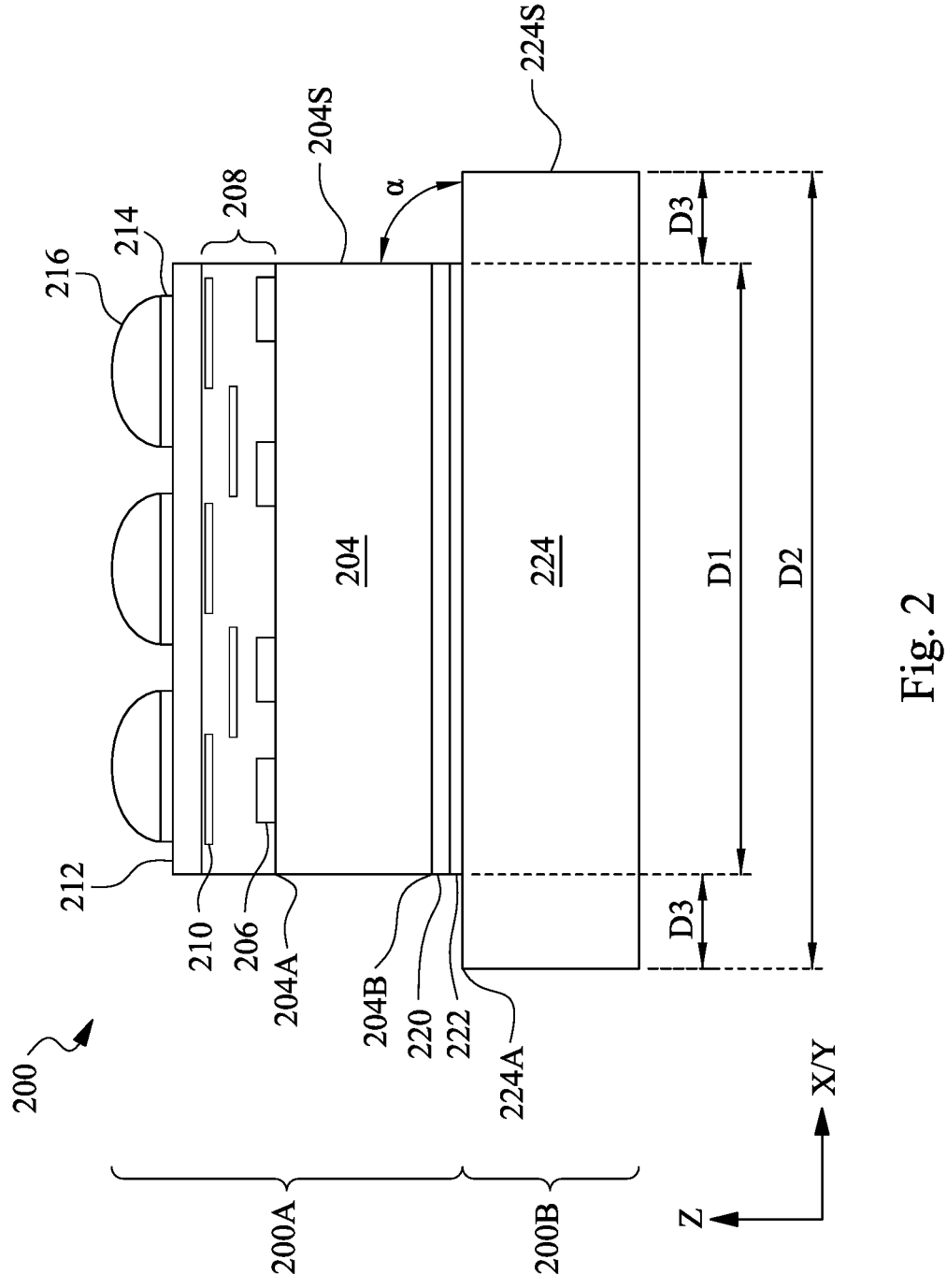
FIG. 2 illustrates a cross-sectional view of a portion of the example semiconductor package of FIG. 1 along line AA', in accordance with some embodiments.

FIGS. 1 and 2 collectively illustrate a schematic diagram of at least a portion of a semiconductor package (or chip) 200, in accordance with various embodiments. FIG. 1 illustrates a planar top view of the semiconductor package 200 and FIG. 2 illustrates a cross-sectional view of the semiconductor package 200 taken along line AA' of FIG. 1. It should be appreciated that the example semiconductor package 200 of FIGS. 1 and 2 is merely an illustrative embodiment, and is not intended to limit the scope of present disclosure. Hence, the example semiconductor package 200 can include various of other components (e.g., an interposer, one or more through silicon/substrate via (TSV) structures, an underfill material, an encapsulant material, etc.), while remaining within the scope of present disclosure.

As shown, the semiconductor package 200 includes a die 200A fused with a carrier 200B. In the present embodiments, the die 200A includes device substrate 204, a number of active and/or passive device features 206 (e.g., transistors, resistors, capacitors, etc.) formed along a frontside 204A of the device substrate 204, and a number of metallization layers 208 formed over the device features 206. Though not depicted separately, each of the metallization layers 208 can include a number of conductive lines and a number of conductive vias, which are collectively referred to as interconnect structures 210. In some embodiments, the conductive lines are each formed as a conductive (e.g., metal) structure extending along a lateral direction (e.g., the X direction or the Y direction), and the conductive vias are each formed as a conductive (e.g., metal) structure extending along a vertical direction (e.g., the Z direction). Some of the device features 206 can be operatively coupled to each other (through a respective group of the interconnect structures 210) so as to provide a respective function (e.g., a Boolean logic function), which may sometimes be referred to as a cell.

Further on the frontside 204A of the device substrate 204, the semiconductor package 200 may optionally include a redistribution structure (not depicted) configured to reroute or redistribute the interconnect structures 210 of the die 200A. The die 200A may further include a passivation layer 212 over the interconnect structures 210 and optionally the redistribution structure. In some embodiments, the interconnect structures 210 and/or the redistribution structure are coupled to a number of conductive connectors 216 through the passivation layer 212. The conductive connectors 216 may be implemented as solder balls (depicted herein as an example embodiment), metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The conductive connectors 216 may further connect the semiconductor package 200 to a package substrate (not depicted) that includes one or more semiconductor material. In some instances, the package substrate may be an interposer. In some embodiments, as depicted herein, the die 200A further includes an under-bump metallization layer (UBM) 214 between the passivation layer 212 and the conductive connectors 216 to facilitate the bonding of the conductive connectors to the interconnect structures 210. The UBM 214 may include a metal such as nickel, gold, other suitable metals, or combinations thereof. It is noted that the components shown here are for illustrative purposes only and that the semiconductor package 200 may include additional components not depicted herein.

In the present embodiments, the carrier 200B includes a carrier substrate 224 bonded to a backside 204B of the device substrate 204 through a suitable bonding method, such as fusion bonding, hybrid bonding, direct bonding, dielectric bonding, metal bonding, solder joints (e.g., microbumps), or the like. In the present embodiments, the device substrate 204 of the die 200A is bonded to the carrier substrate 224 by fusion bonding. In this regard, a bonding film 220 on the backside 204B of the device substrate 204 is bonded to a bonding film 222 on a top surface (or frontside) 224A of the carrier substrate 224 by performing an annealing process to facilitate the chemical bonding between the bonding films. In some embodiments, the bonding films 220 and 222 each include an oxide material. In the present embodiments, the carrier 200B is configured to facilitate the handling and transport of the die 200A (and the components formed thereon). In this regard, the carrier substrate 224 may not include any device features or interconnect structures formed thereover.

In the present embodiments, both the device substrate 204 and the carrier substrate 224 include the same semiconductor material(s). The semiconductor material may include an elementary semiconductor material such as silicon, germanium, diamond, other elementary semiconductor material, a compound semiconductor material such as silicon germanium, silicon carbide, gallium arsenic, indium arsenide, indium phosphide, silicon germanium carbide, gallium arsenic phosphide, gallium indium phosphide, other compound semiconductor materials, or combinations thereof. In many embodiments, both the device substrate 204 and the carrier substrate 224 include silicon.

In some embodiments, at least one of the device substrate 204 and the carrier substrate 224 include a dopant species such as boron, carbon, nitrogen, oxygen, sulfur, phosphorus, other dopants, or combinations thereof. In some embodiments, the dopant species are introduced to form various doped regions (or doped wells) over the device substrate 204. In some embodiments, both the device substrate 204 and the carrier substrate 224 include the same dopant species but at different concentrations. In the present embodiments, the concentration of the dopant species in the device substrate 204 is less than that in the carrier substrate 224. For example, both the device substrate 204 and the carrier substrate 224 include silicon doped with boron, where the concentration of boron in the device substrate 204 is less than the concentration of boron in the carrier substrate 224. Other combinations of semiconductor material(s) and dopant species may also be applicable in the present embodiments. In some embodiments, a difference in the concentration of the dopant species between the device substrate 204 and the carrier substrate 224 is at least about $5 \times 10^{15}$ $cm^{-3}$. As will be discussed in detail below, the minimum difference of about $5 \times 10^{15}$ $cm^{-3}$ ensures sufficient etching selectivity between the device substrate 204 and the carrier substrate 224 during the fabrication of the semiconductor package 200. In this regard, the device substrate 204 with less dopant species may be etched at a higher rate than the carrier substrate 224. In one example embodiment, the device substrate 204 may include silicon doped with boron at a concentration of about $1.12 \times 10^{15}$ $cm^{-3}$ to about $1.68 \times 10^{15}$ $cm^{-3}$ and the carrier substrate 224 may include silicon doped with boron at a concentration of about $1.33 \times 10^{14}$ $cm^{-3}$ to about $3.21 \times 10^{16}$ $cm^{-3}$. In some embodiments, the choice of dopant species and the concentration thereof in the device substrate 204 is selected based on design requirements specific to the applications of the semiconductor package 200.

In some embodiments, the device substrate 204 and the carrier substrate 224 include the same semiconductor material(s) but in different crystal structures (or lattices). The crystal structures of the semiconductor material describe repeating structures in which atoms are arranged or packed in a three-dimensional space. For example, atoms of the semiconductor material(s) in the device substrate 204 may be arranged in an orthorhombic structure and those in the carrier substrate 224 may be arranged in a monoclinic structure. An orthorhombic structure may be defined as a rectangular prism with a first vector ("a") and a second vector ("b") forming a rectangular base of the prism and a third vector ("c") as a height of the prism, where the first, the second, and the third vectors are unequal in length. A monoclinic structure may be defined as a rectangular prism having a parallelogram base rather than a rectangular base, as in the case of the orthorhombic structure. The monoclinic structure also includes three unequal vectors, similar to those of the orthorhombic structure. In some embodiments, the atoms in the device substrate 204 are arranged in a cubic structure (e.g., a diamond cubic structure), while those in the carrier substrate 224 are arranged in a monoclinic structure. The cubic structure may be alternatively considered a special case of the orthorhombic structure.

In the present embodiments, differences in crystal structures between the device substrate 204 and the carrier substrate 224 contribute to etching selectivity therebetween, as will be discussed in detail below. In this regard, the device substrate 204 having an orthorhombic (or cubic) structure, for example, may be etched at a greater rate than the carrier substrate 224 having a monoclinic structure. In some embodiments, the effects of the differences in crystal structures on etching selectivity between the device substrate 204 and the carrier substrate 224 may be additional or alternative to the effects of the differences in dopant concentration.

Referring to FIGS. 1 and 2 collectively, the carrier substrate 224 is configured to have a greater length (along the X or the Y axis) than the device substrate 204. As shown here in an example X-Y plane, the device substrate 204 may be defined by a length D1, the carrier substrate 224 may be defined by a length D2, which is greater than D1, and approximately half of the difference between D1 and D2 may be defined as a distance D3, which is greater than 0. In other words, when viewed from a top view, such as that shown in FIG. 1, each sidewall of the carrier substrate 224 is offset from each sidewall of the device substrate 204 by the distance D3. It is noted that components formed over the device substrate 204 are omitted in FIG. 1 for purposes of simplicity. In the present embodiments, the distance D3 defines a border for handling the semiconductor package 200 during subsequent processing, as will be discussed in detail below. The present embodiments do not limit the magnitude of the distance D3 so long as it accommodates the handling of the device substrate 204 (and the device features 206 formed thereover) without causing potential damages. In a non-limiting example embodiment, the distance D3 may be at least about 4 mm with the length D1 being about 22 mm and the length D2 between about 25.7 mm.

When viewed from a cross-sectional side view, such as that shown in FIG. 2, the device substrate 204 and the carrier substrate 224 form a step-like (or stair-like) profile, where an angle $\alpha$ between a sidewall 204S of the device substrate 204 and the top surface 224A of the carrier substrate 224 is at least about 85°. It is understood that the sidewall 204S of the device substrate 204 also extends vertically to define sidewalls of the metallization layers 208 and the passivation layer 212. In some embodiments, the angle $\alpha$ is substantially orthogonal (or perpendicular), i.e., about 90°. In other words, the sidewall 204S of the device substrate 204 is substantially vertical with respect to the top surface 224A of the carrier substrate 224. Furthermore, a sidewall 224S of the carrier substrate 224 may also be substantially vertical with respect to the top surface 224A of the carrier substrate 224. In the present embodiments, the sidewalls of the device substrate 204

Figure 3B:
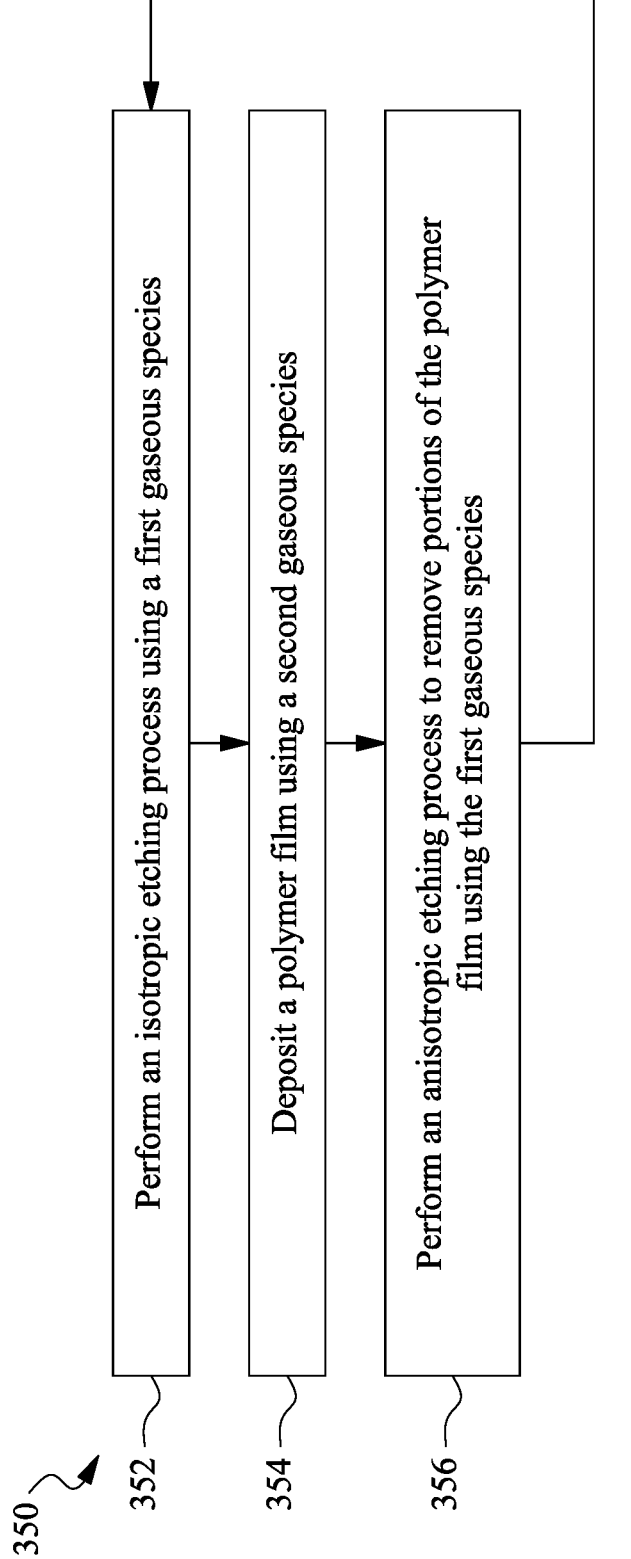

FIGS. 3A and 3B illustrate flow charts of an example method 300 and an example method 350, respectively, for forming at least a portion of the semiconductor package 200, in accordance with some embodiments. It should be noted that the methods 300 and 350 are merely examples, and are not intended to limit the present disclosure. Accordingly, it is understood that the order in which operations of the methods 300 and/or 350 may be altered, that some of the operations may be omitted, and that additional operations may be provided before, during, and after the methods 300 and/or 350. In accordance with some embodiments provided herein, operations of the methods 300 and/or 350 may be discussed in conjunction with FIGS. 4A-4M, which may depict at least some of the components discussed with respect to FIGS. 1 and 2. In the present embodiments, operation 308 of the method 300 is implemented by the method 350, which is discussed in conjunction with FIGS. 4F-4L, according to some embodiments of the present disclosure.

Figures 4A, 4B:
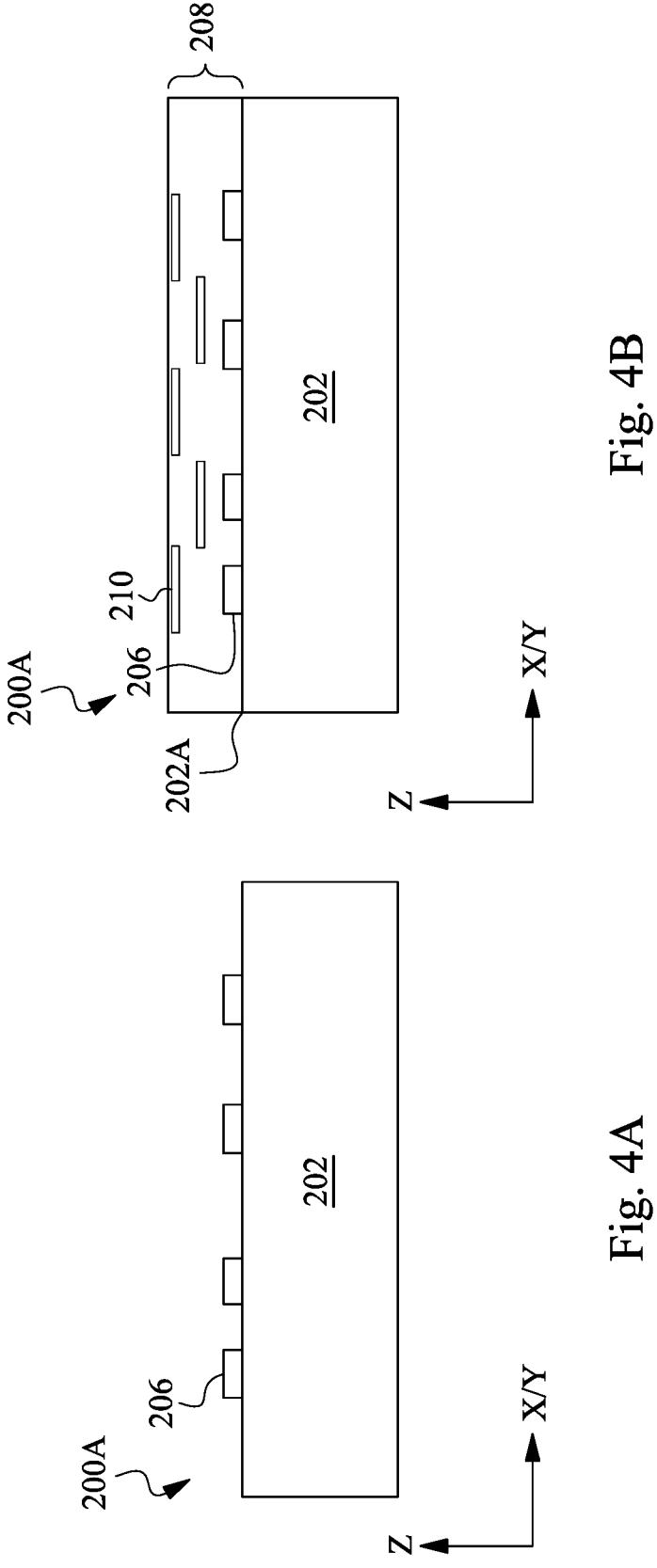

Referring to FIG. 4A, the method 300 at operation 302 forms the die 200A that includes the device features 206 over a device wafer 202.

Figures 1, 2, 4C:
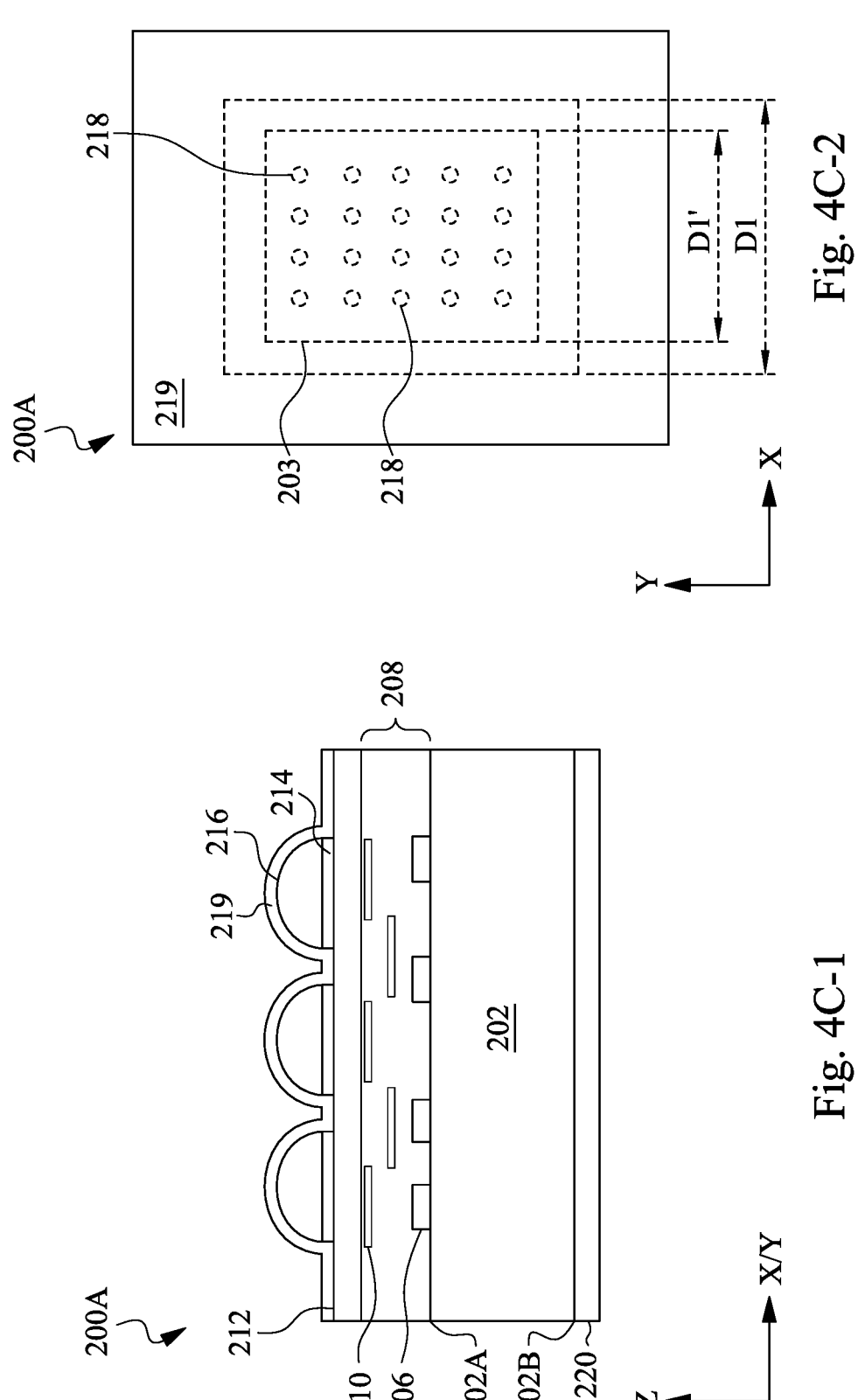
Figure 4D:
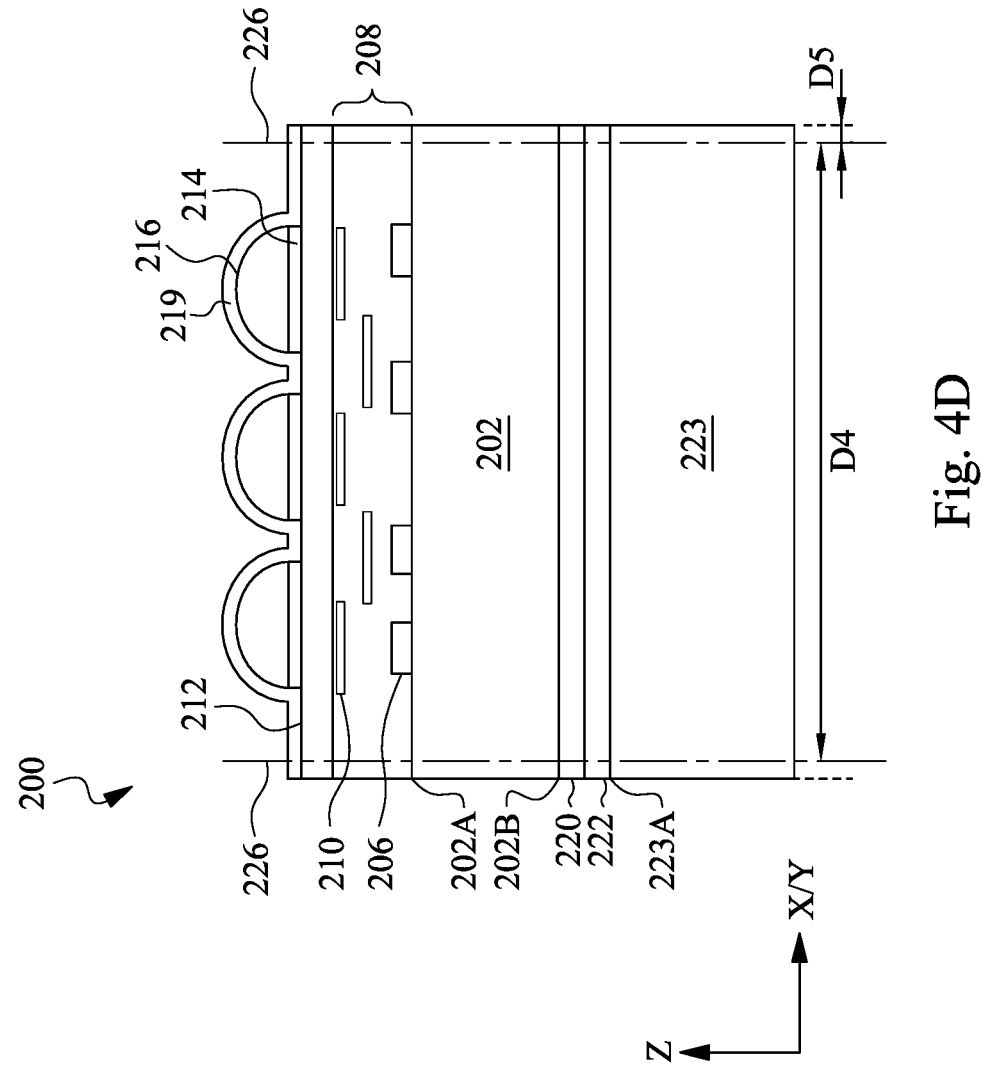

In the present embodiments, the device substrate 204 depicted in FIGS. 1 and 2 is isolated from the device wafer 202 along scribe lines 226 as depicted in FIG. 4D at a subsequent operation. In other words, the portion of the device wafer 202 spanning between the scribe lines 226 provides the device substrate 204 over which the die 200A is formed. Accordingly, as discussed in detail above with respect to the device substrate 204, the device wafer 202 includes one or more semiconductor materials doped with one or more dopant species. In some embodiments, the device wafer 202 includes silicon (e.g., a silicon wafer) doped with boron. In some embodiments, the silicon atoms of the device wafer 202 has an orthorhombic crystal structure (including a cubic crystal structure) as discussed above. The device wafer 202 may be doped by a suitable process, such as an ion implantation process. Various parameters of the ion implantation process, including beam energy and beam power, for example, may be tuned based on the desired location (e.g., depth) at which the dopant species are introduced. Subsequently, the method 300 forms the device features 206 over a frontside 202A of the device wafer 202 by processes including, for example, deposition, lithography, etching, other suitable processes, or combinations thereof.

Referring to FIG. 4B, the method 300 at operation 302 subsequently forms the interconnect structures 210 in the metallization layers 208 and over the device wafer 202.

The metallization layers 208 may be a multi-layered structure including dielectric layers such as interlayer dielectric (ILD) layers separated by etch-stop layers (ESLs) deposited over the device features 206. The interconnect structures 210 may include conductive lines connected vertically by vias configured to electrically connect the device features 206 with additional circuit components. The various interconnect structures 210 may be formed by one or more damascene processes or a series of deposition and patterning processes.

Furthermore, referring to FIGS. 4C-1 and 4C-2, the method 300 at operation 302 forms additional components such as the passivation layer 212, the UBM 214, the conductive connectors 216, and other suitable components over the interconnect structures 210, thereby providing connection between the underlying device features 206 and interconnect structures 210 to components such as a package substrate. Suitable processes including deposition, lithography, etching, other suitable processes, or combinations thereof may be applied to form one or more of such components.

In some embodiments, referring to FIG. 4C-2, the method 300 further forms a plurality of openings (or holes) 218 through the one or more components formed at operation 302 and through the device wafer 202 in a device region 203. In some embodiments, the device region 203 provides the device features 206, such as MEMS devices, according to design requirements, and may have an area less than that of the device substrate 204. In this regard, the device region 203 may be defined by a width D1' along the X axis, where D1' is less than D1 as shown. An example of a MEMS device (e.g., the device feature 206) may be implemented as an E-beam writer for lithography applications. In this instance, the plurality of openings 218 are configured as apertures for the E-beam to penetrate during device operation. It is noted that the present embodiments do not limit the configuration (e.g., shape of each opening 218, pattern of arrangement, etc.) of the openings 218 or the method by which they are formed during operation 302. For illustration purposes, FIG. 4C-2 depicts an example configuration of the openings 218.

Thereafter, the method 300 forms a hard mask 219 over the die 200A to protect the various features formed over the device wafer 202. In some embodiments, the hard mask 219 includes a semiconductor material, a dielectric material, other suitable materials, or combinations thereof. In the present embodiments, the hard mask 219 includes silicon. As discussed in detail below, the hard mask 219 is subsequently removed after performing a singulation process to form the semiconductor package 200.

Subsequently, the method 300 forms the bonding film 220 on a backside 202B of the device wafer 202. The bonding film 220 may include any suitable material such as an oxide and may be formed over the backside 202B by any method such as chemical vapor deposition (CVD), spin-on-coating, thermal oxidation, chemical oxidation, other suitable methods, or combinations thereof.

Referring to FIG. 4D, the method 300 at operation 304 bonds or fuses the backside 202B of the device wafer 202 (i.e., the backside 204B) with a frontside (or backside) 223A of a carrier wafer 223 (i.e., the top surface 224A) via the bonding films 220 and 222.

The carrier substrate 224 depicted in FIGS. 1 and 2 is subsequently isolated from the carrier wafer 223 after bonding the device wafer 202 to the carrier wafer 223. Accordingly, as discussed in detail above with respect to the carrier substrate 224, the carrier wafer 223 includes one or more semiconductor materials doped with one or more dopant species. The one or more dopant species in the carrier wafer 223 may be the same as those included in the device wafer 202 in composition. The carrier wafer 223 may be doped by a suitable process, such as an ion implantation process, similar to that discussed above with respect to the device wafer 202. In the present embodiments, the concentration of the dopant species in the carrier wafer 223 is greater than that in the device wafer 202. In some embodiments, the carrier wafer 223 includes silicon (e.g., a silicon wafer) doped with boron. In some embodiments, the silicon atoms of the carrier wafer 223 has a monoclinic crystal structure as discussed above, as opposed to the orthorhombic (or cubic) crystal structure of the device wafer 202. In the present embodiments, the differences in dopant concentration and in crystal structure between the carrier wafer 223 and the device wafer 202, alone or in combination, contribute to etching selectivity between the carrier wafer 223 and the device wafer 202, as will be discussed in detail below.

The carrier wafer 223 further includes the bonding film 222 formed over the frontside 223A. The bonding film 222 may be substantially the same as the bonding film 220 and may be formed in a manner similar to that discussed above with respect to the bonding film 220. In the present embodiments, the device wafer 202 and the carrier wafer 223 are bonded by a fusion bonding. In this regard, bonding the carrier wafer 223 to the device wafer 202 may include a pre-bonding process followed by an annealing process. During the pre-bonding process, a small pressing force is applied to press the bonding films 220 and 222 together at a low temperature, such as at room temperature. Subsequently, the bonding strength may be improved by the annealing process, during which the material of the bonding films 220 and 222 form fusion bonds, e.g., covalent bonds. In some alternative examples, the carrier wafer 223 may be bonded to the device wafer 202 by other suitable bonding methods such as hybrid bonding and solder joints (e.g., microbumps).

Figure 4E:
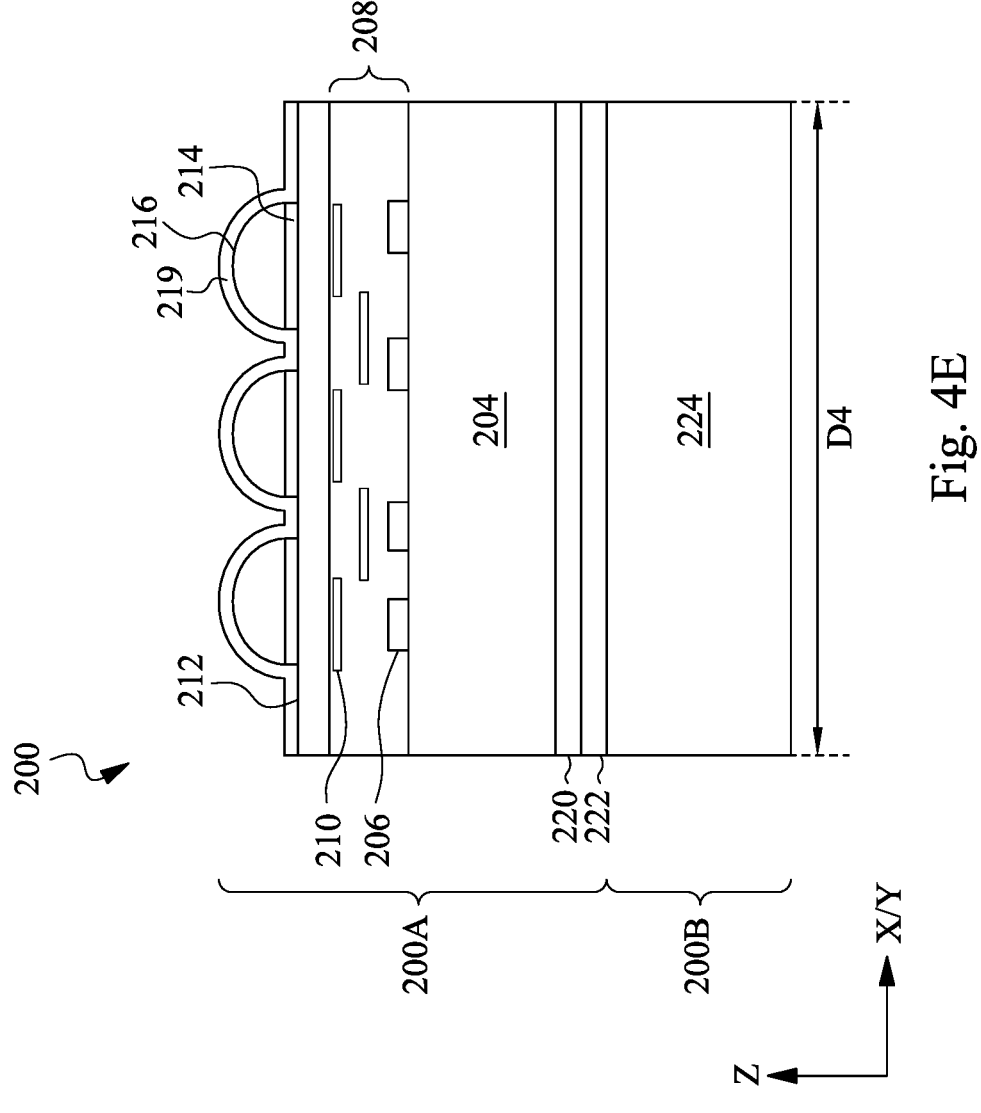

Referring to FIG. 4E, the method 300 at operation 306 fabricates the semiconductor package 200 from the bonded device wafer 202 and carrier wafer 223 by a die singulation (or die cutting) process. In the present embodiments, the die singulation process is implemented along the scribe lines 226 as shown in FIG. 4D, which are each separated from a sidewall of the resulting semiconductor package 200 by a distance D5. In some embodiments, D5 is less than D3 as depicted in FIGS. 1 and 2. In some non-limiting examples, D5 is about 70 μm. It is noted that after performing the device singulation process to form the semiconductor package 200, the device substrate 204 and the carrier substrate 224 are configured with substantially the same width D4, i.e., no step-like profile is present along sidewalls of the device substrate 204 and the carrier substrate 224. The die singulation process may include a sawing process, a laser cutting process, or the like. The singulation process singulates (or cuts) the semiconductor package 200 from the bonded device wafer 202 and carrier wafer 223.

Referring to FIGS. 4F-4L, the method 300 at operation 308 performs a series of etching and deposition processes to trim sidewalls of the semiconductor package 200. In the present embodiments, the series of etching and deposition processes is implemented by operations of the method 350 as depicted in FIG. 3B. For embodiments in which the hard mask 219 is formed over the device substrate 204, the series of etching and deposition processes is configured to remove the hard mask 219, thereby revealing at least the plurality of the openings 218 in the device region 203. It is noted that the hard mask 219 may be removed at any stage during the implementation of the method 350.

Figure 4F:
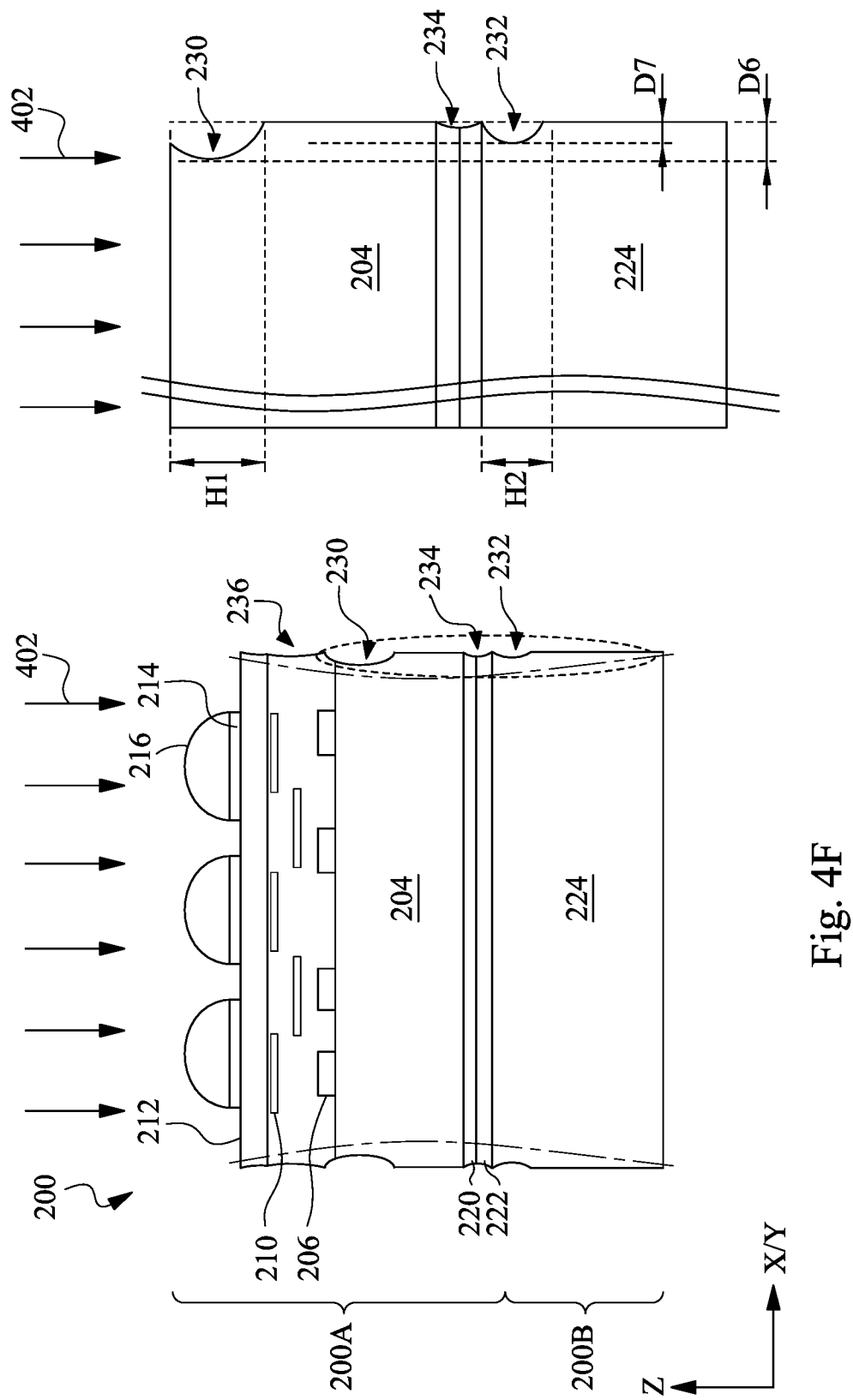

Referring to FIG. 4F, the method 350 at operation 352 performs an etching process 402 to the semiconductor package 200. In the present embodiments, the etching process 402 utilizes one or more gaseous species (that form a plasma) as the etchant and designed to selectively remove one or more silicon-based layers (e.g., the hard mask 219) without removing, or substantially removing, other components included in the semiconductor package 200. In the present embodiments, the etching process 402 is a reactive ion etching (RIE) process.

In existing technologies, implementing the etching process 402 may inadvertently remove (or over-etch) portions of both the device substrate 204 and the carrier substrate 224, creating a curved profile (as depicted in a dotted line in FIG. 4F) along the entire sidewall of the semiconductor package 200 extending from the top of the device substrate 204 (and the components formed thereover) to the bottom of the carrier substrate 224. In this regard, the top and the bottom corners of the curved profile may become stress concentrators when a mechanical force (e.g., a clamping force applied during device testing) is applied, leading to cracking of the semiconductor package 200.

The present embodiments provide a method of selectively over-etching the device substrate 204 with respect to the carrier substrate 224, such that the sidewalls of the semiconductor package 200 are formed to include a step-like or stair-like profile. Consequently, instead of applying the mechanical force on both the device substrate 204 and the carrier substrate 224, only a portion of the carrier substrate 224 that extends away from the device substrate 204 is subjected to the stress, reducing the occurrence of mechanical failure of the semiconductor package 200. In the present embodiments, the series of cyclic etching and deposition processes depicted in the method 350 is implemented to ensure that the sidewalls of both the device substrate 204 and the carrier substrate 224 are etched to be substantially vertical and that the device substrate 204 is preferentially etched over the carrier substrate 224, such that the carrier substrate 224 extends laterally away from the sidewall of the device substrate 204.

Referring to FIG. 4F, the etching process 402 is an isotropic etching process configured to remove portions of the device substrate 204 and the carrier substrate 224 along both the vertical direction (e.g., the Z axis) and the lateral directions (e.g., the X and Y axes) as shown. Details of the etching process 402 and the subsequent operations of the method 350 are discussed in reference to an enlarged depiction of a portion of the semiconductor package 200 encircled by dotted line in FIG. 4F.

In the present embodiments, the etching process 402 is implemented using a plasma that includes one or more gaseous species. The plasma may include an etch gas such as a fluorine-containing gas (e.g., $SF_6$, $CF_4$, $CHF_3$, $CH_2F_2$, $CH_3F$, $C_4F_6$, $NF_3$, or combinations thereof), a chlorine-containing gas (e.g., $Cl_2$, $BCl_3$, or a combination thereof), a bromine-containing gas (e.g., HBr), Hz, other suitable etch gases, or combinations thereof. Additionally, the plasma may include other gases such as $O_2$, Na, $CO_2$, $SO_2$, CO, $CH_4$, $SiCl_4$, other suitable gases, or combinations thereof. In the present embodiments, the plasma includes a fluorine-based gas such as $SF_6$, and $O_2$ in some instances. In some embodiments, to ensure the removal of the silicon-based hard mask 219 in the semiconductor package 200, the fluorine-based gas implemented at the etching process 402 is dissociated into fluorine atoms, which subsequently react with silicon to form a silicon-and-fluorine-containing gas to be removed from the deposition chamber.

As depicted in the enlarged portion of the semiconductor package 200 in FIG. 4F, the etching process 402 forms a recess 230 in the device substrate 204, a recess 232 in the carrier substrate 224, and a recess 234 in the bonding films 220/222. However, due to the differences in dopant concentration and/or crystal structure between the device substrate 204 and the carrier substrate 224 discussed in detail above, dimensions of the recess 230 differs from those of the recess 232. In other words, the etching rate of the device substrate 204 differs from that of the carrier substrate 224. In the present embodiments, the differences in dopant concentration and/or the crystal structure is tuned such that the device substrate 204 is etched to a greater extent than the carrier substrate 224. For example, the recess 230 may be defined by a width D6 and a height H1 and the recess 232 may be defined by a width D7 and a height H2, where D6 is greater than D7 and H1 is greater than H2. In some embodiments, a vertical etching selectivity and a lateral etching selectivity between the device substrate 204 to the carrier substrate 224 may differ. Dimensions of the recesses 230 and 323 may be tuned by adjusting the etching selectivity between the device substrate 204 and the carrier substrate 224.

It is noted that although portions of the bonding films 220/222 and/or the metallization layers 208 (and the passivation layer 212) may also be etched during the etching process 402 (and any subsequent etching processes) to form recesses 234 and 236, respectively, the etchant applied during the etching process 402 is tuned to primarily remove a semiconductor material (e.g., the hard mask 219) in the semiconductor package 200 without removing, or substantially removing, neighboring dielectric and metal materials. In some embodiments, the dimensions of the recesses 230 and 232 are controlled by factors such as power, duration, choice of etchant, and/or other factors of the etching process 402. In some embodiments, no bias is applied during the etching process 402 to ensure the removal of the material is isotropic.

Figure 4H:
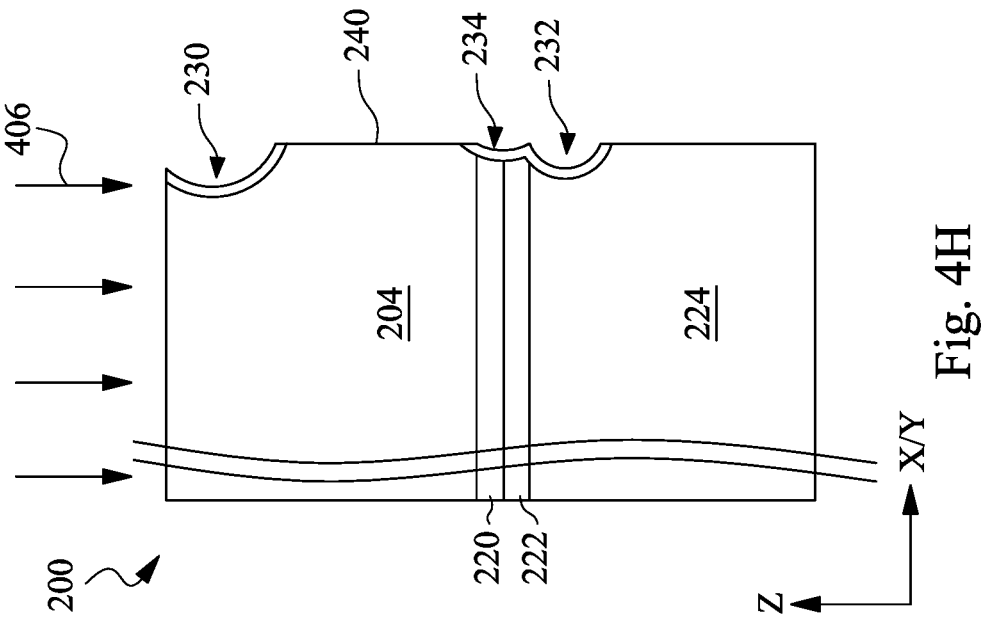
Figure 4G:
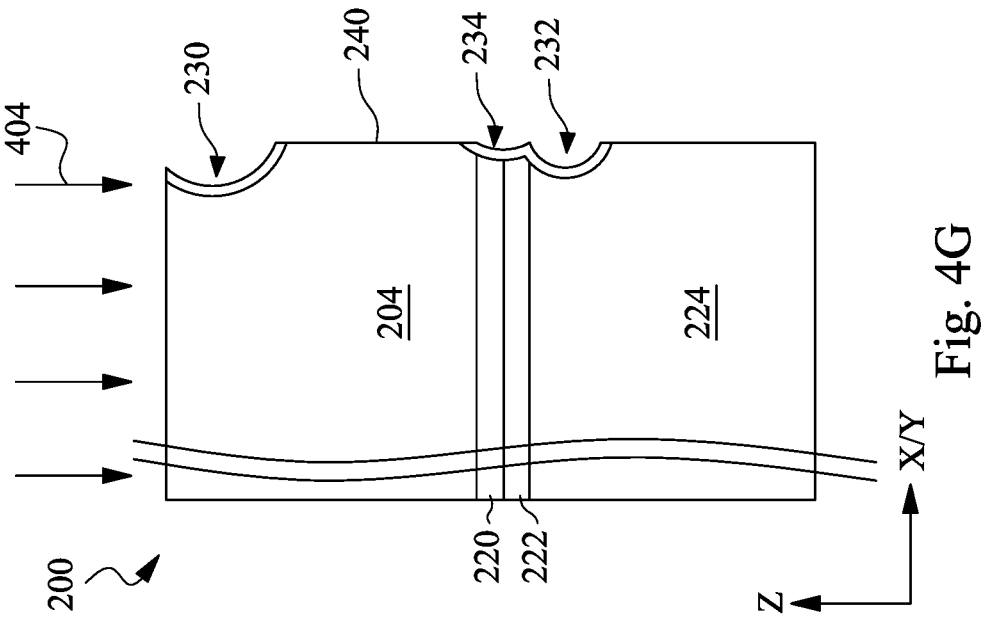

Referring to FIG. 4G, the method 350 at operation 354 performs a deposition process 404 to the semiconductor package 200. In the present embodiments, the deposition process 404 utilizes one or more gaseous species (also in the form of a plasma) different from those implemented at the etching process 402 to form a polymer layer 240 over the semiconductor package 200. In some embodiments, the polymer layer 240 is formed conformally over the semiconductor package 200, such that it overlays the exposed surfaces of the recesses 230 and 232.

In the present embodiments, the deposition process 404 is implemented using a plasma that includes one or more gaseous species. In some embodiments, the plasma may include a fluorine-containing gas selected from the examples discussed above with respect to the etching process 402. However, the fluorine-containing gas source implemented at the deposition process 404 is distinctly different from that implemented at the etching process 402. For example, in the present embodiments, the plasma used for the deposition process 404 includes CIF's, which is in contrast to $SF_6$ used for the etching process 402. Additionally, the plasma may include other gases such as $O_2$, $N_2$, $CO_2$, $SO_2$, CO, $CH_4$, $SiCl_4$, other suitable gases, or combinations thereof.

In the present embodiments, using $C_4F_8$ as an example, the fluorine-based gas implemented at the deposition process 404 is dissociated into monomers such as $CF_2$, which subsequently adsorb on (or adhere to) the exposed surfaces of the semiconductor package 200 and polymerize to form the polymer layer 240. As will be discussed in detail below, portions of the polymer layer 240 are removed by a subsequent anisotropic etching process and the remaining portions of the polymer layer 240 over sidewalls of the recesses 230 and 232 protect the device substrate 204 and the carrier substrate 224 from being substantially etched. In other words, the polymer layer 240 serves as a protection layer during the subsequent etching process to ensure that the device substrate 204 and the carrier substrate 224 are etched to form substantially vertical sidewalls 204S and 224S, respectively, as shown in FIG. 2.

Referring to FIG. 4H, the method 350 at operation 356 performs an etching process 406 to the semiconductor package 200. In the present embodiments, the etching process 406 differs from the etching process 402 in that the etching process 406 is an anisotropic RIE process configured to selectively remove portions of the polymer layer 240 formed over lateral surfaces of the semiconductor package 200 (not depicted herein). The etching process 406 may be implemented using the same gases as the etching process 402. In an example embodiment, the etching process 406 may be implemented using a combination of $SF_6$ and $O_2$. To achieve the directionality of the anisotropic etching process, a bias may be applied during the etching process 406. The magnitude of the bias may be tuned to ensure the lateral portions of the polymer layer 240 are substantially removed. Importantly, the etching process 406 does not substantially remove the polymer layer 240 formed in the recesses 230 and 232, thereby limiting the lateral etching with respect to the vertical etching of the device substrate 204 and the carrier substrate 224.

Figure 4I:
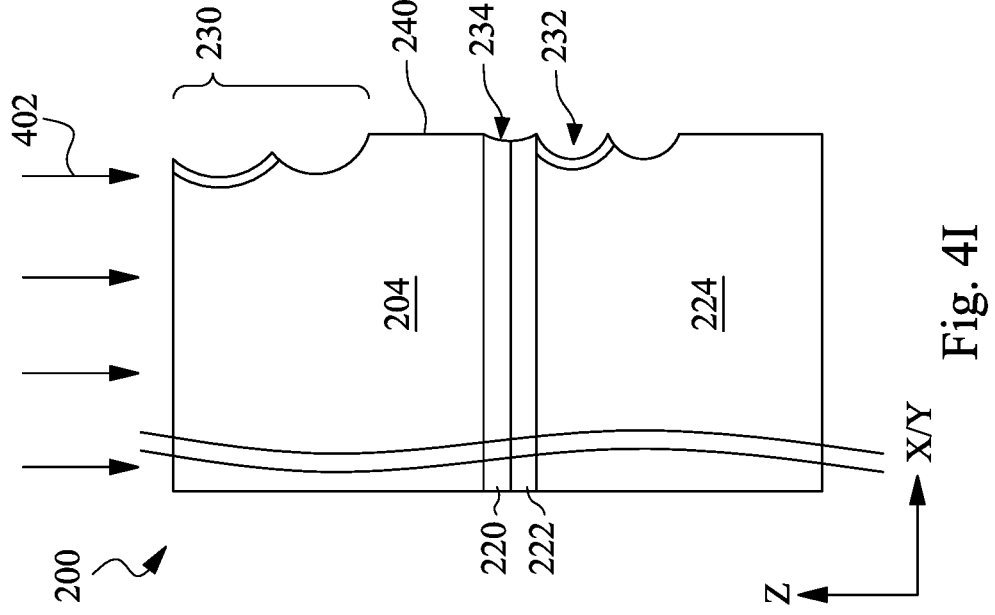
Figure 4K:
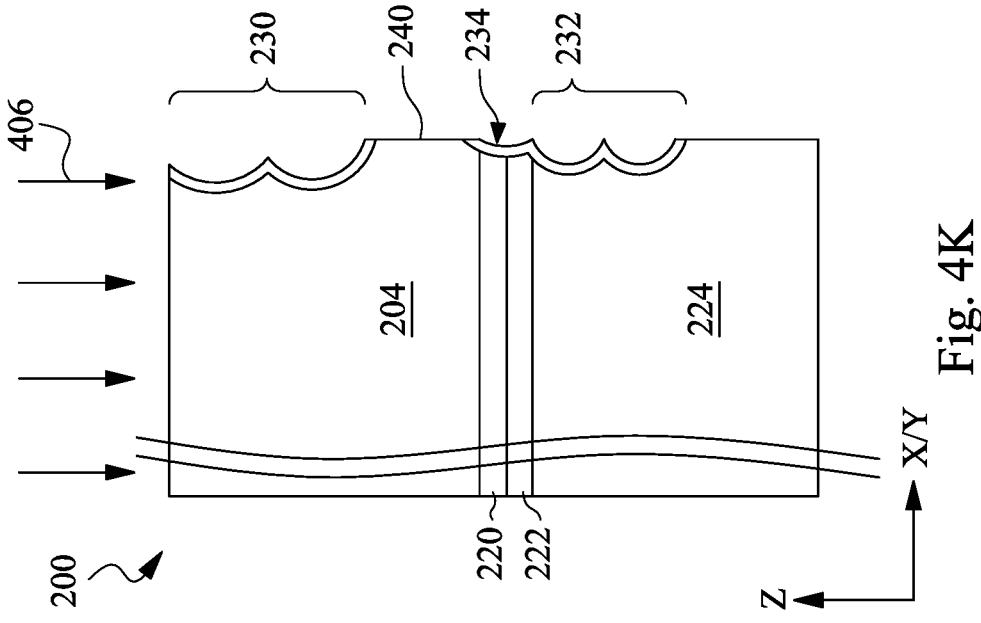
Figure 4J:
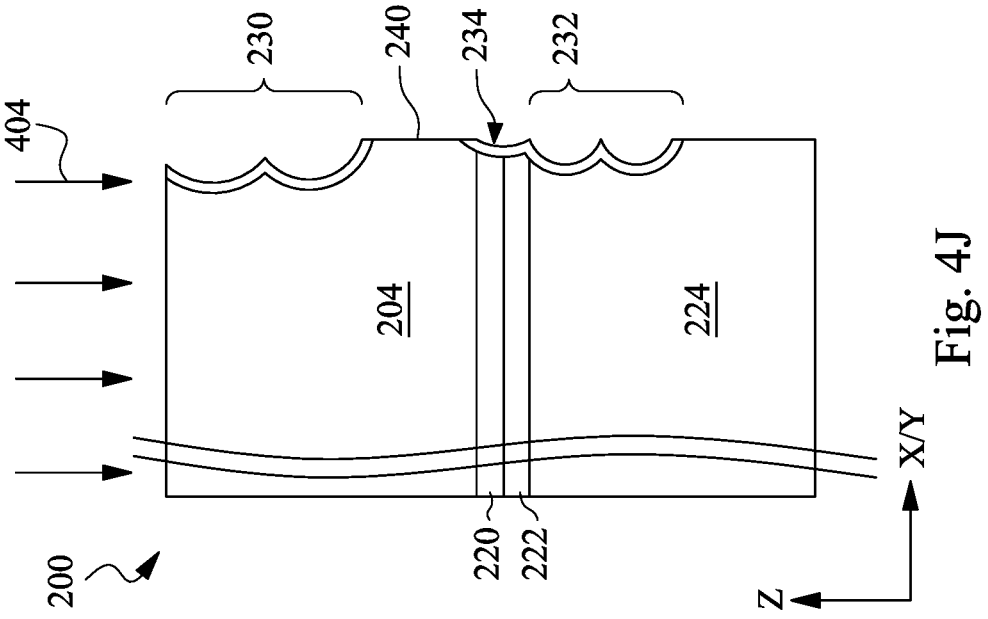

Referring to FIGS. 4I, 4J, and 4K, the method 350 repeats operations 352-356 to vertically extend the recesses 230 and 232 without substantially removing the polymer layer 240. As shown here, the sidewalls of the recesses 230 and 232 may be formed to have a scalloped profile when the method 350 proceeds from one operation to a subsequent operation with the switching of the gas sources and/or the application of bias, for example. In some embodiments, tuning the duration of one or more of the etching process 402, the deposition process 404, and the etching process 406 reduces the roughness arising from the scalloped profile (see the dotted profile depicted in FIG. 4L as an example), thereby achieving substantially vertical sidewalls in the etched device substrate 204 and the etched carrier substrate 224.

Figure 4M:
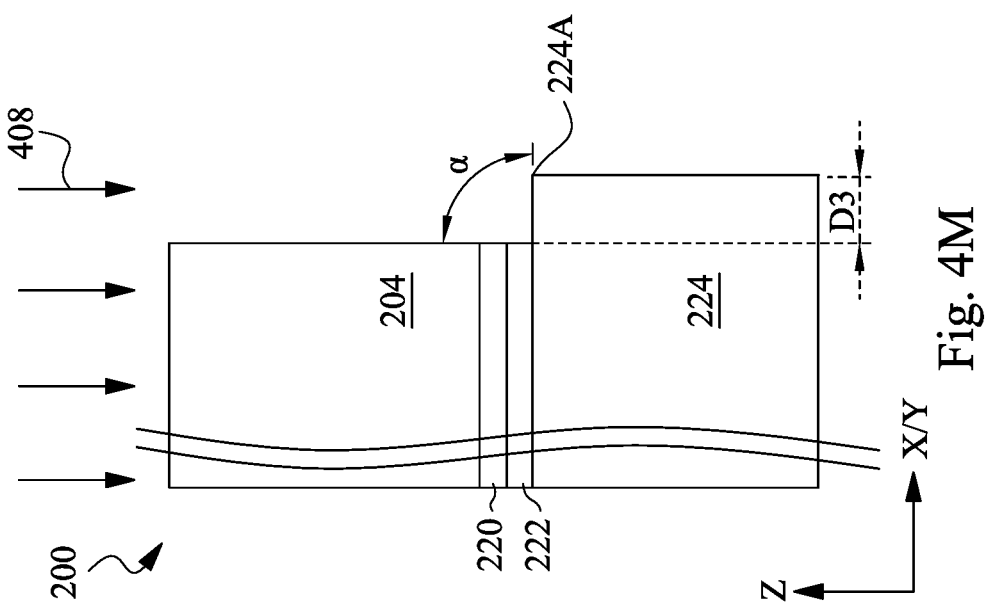
Figure 4L:
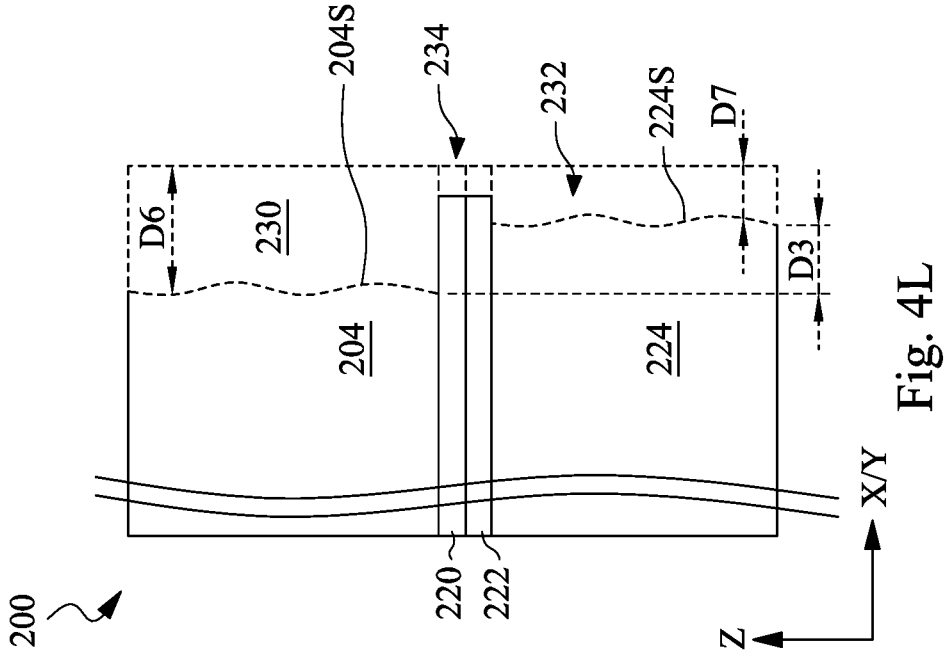

In the present embodiments, referring to FIG. 4L, the operations 352-356 are implemented cyclically until the recesses 230 and 232 extend vertically through a thickness of the device substrate 204 and a thickness of the carrier substrate 224, respectively. Subsequently, the polymer layer 240 is removed from the semiconductor package 200 to expose the sidewalls 204S and 224S. Importantly, the etching selectivity between the device substrate 204 and the carrier substrate 224 results in the width D6 of the recess 230 to be greater than the width D7 of the recess 232. Furthermore, because the cyclic application of the operations 352-356 is selective to the device substrate 204 and the carrier substrate 224, the bonding films 220 and 222 are not substantially etched and therefore extend laterally from the sidewalls 204S and 224S.

Thereafter, referring to FIGS. 3A and 4M, the method 300 proceeds from operation 308 to operation 310 by performing a wet etching process 408 to remove any excess portions of the bonding films 220 and 222 and other components (e.g., the passivation layer 212, the metallization layers 208, etc.) not substantially affected by the cyclic application of the operations 352-356 from the semiconductor package 200. In the present embodiments, the wet etching process 408 is implemented using an etchant such as hydrofluoric acid (HF).

Additional processing may be implemented at operation 312. For example, multiple semiconductor packages 200 may be integrated (or stacked) together in various configurations to form a system on integrated chips (SoIC). However, it should be understood that the semiconductor dies can be integrated in any of various other arrangements, while remaining within the scope of present disclosure.

In one aspect of the present disclosure, a method of fabricating a semiconductor package is provided. The method includes forming a semiconductor die including a plurality of devices over a first substrate, where the first substrate includes a dopant at a first concentration. The method includes bonding a backside of the first substrate to a second substrate, where the second substrate is free of devices and includes the dopant at a second concentration greater than the first concentration. The method includes singulating the semiconductor die bonded to the second substrate to form a semiconductor package. The method further includes performing a trimming process to the semiconductor package, resulting the first substrate to have a first width and the second substrate to have a second width, where the second width is greater than the first width.

In another aspect of the present disclosure, a method for fabricating semiconductor packages is provided. The method includes forming a semiconductor die including device features over a first substrate, where the first substrate includes a dopant at a first concentration. The method includes fusing a backside of the first substrate with a second substrate, where the second substrate includes the dopant at a second concentration greater than the first concentration. The method includes cutting the semiconductor die bonded to the second substrate to form a semiconductor package.

The method further includes etching sidewalls of the semiconductor package, where the step of etching the sidewalls includes selectively etching the first substrate with respect to the second substrate.

In yet another aspect of the present disclosure, a semiconductor package is provided. The semiconductor package includes a die having a plurality of devices over a first substrate, where the first substrate includes a dopant at a first concentration and the first substrate has a first width along a horizontal direction. The semiconductor package further includes a second substrate fused with the first substrate, where the second substrate includes the dopant at a second concentration greater than the first concentration. The second substrate has a second width along the horizontal direction, where the second width is greater than the first width The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a semiconductor die including a plurality of devices over a first substrate, wherein the first substrate includes a dopant at a first concentration;
bonding a backside of the first substrate to a second substrate, wherein the second substrate includes the dopant at a second concentration greater than the first concentration;
singulating the semiconductor die to form a semiconductor package; and
trimming the semiconductor package such that the first substrate has a first width and the second substrate has a second width that is greater than the first width,
wherein the first substrate includes a first semiconductor material and the second substrate includes a second semiconductor material having a different crystal structure than the first semiconductor material.

2. The method of claim 1, wherein the first substrate and the second substrate include a same semiconductor material.

3. The method of claim 1, wherein the first semiconductor material has an orthorhombic crystal structure and the second semiconductor material has a monoclinic crystal structure.

4. The method of claim 3, wherein the first semiconductor material and the second semiconductor material are the same.

5. The method of claim 1, wherein the dopant includes boron, carbon, nitrogen, oxygen, sulfur, phosphorus, other dopants, or combinations thereof.

6. The method of claim 1, wherein the step of trimming includes:
performing an isotropic etching process using a first gaseous species to form a first recess in the first substrate and a second recess in the second substrate, wherein dimensions of the first recess are greater than dimensions of the second recess;

performing a deposition process to form a polymer layer in the first recess and the second recess using a second gaseous species;

performing an anisotropic etching process using the first gaseous species to remove portions of the polymer layer not deposited in the first recess and the second recess; and repeating the steps of performing the isotropic etching process, performing the deposition process, and performing the anisotropic etching process to deepen the first recess and the second recess.

7. The method of claim 6, wherein the first gaseous species is $SF_6$ and the second gaseous species is $C_4F_8$.

8. The method of claim 1, wherein the trimming step comprising creating a vertical sidewall for the first substrate and a vertical sidewall for the second substrate.

9. The method of claim 1, further comprising performing a wet etching process after performing the trimming step.

10. A method, comprising:

forming a semiconductor die including device features over a first substrate, wherein the first substrate includes a dopant at a first concentration;

fusing a backside of the first substrate with a second substrate, wherein the second substrate includes the dopant at a second concentration greater than the first concentration;

cutting the semiconductor die to form a semiconductor package; and etching sidewalls of the semiconductor package, wherein the step of etching the sidewalls includes selectively etching the first substrate with respect to the second substrate, wherein the second substrate is formed of a semiconductor material arranged in a monoclinic structure.

11. The method of claim 10, wherein the first substrate and the second substrate both include silicon doped with boron.

12. The method of claim 10, wherein the step of fusing includes bonding a first oxide layer on the backside of the first substrate with a second oxide layer on the second substrate.

13. The method of claim 12, further comprising performing a wet etching process to remove portions of the first oxide layer and the second oxide layer after the step of etching the sidewalls.

14. The method of claim 10, wherein the semiconductor package further includes a hard mask over the device features, and wherein the step of etching the sidewalls removes the hard mask from the semiconductor package.

15. The method of claim 10, wherein the step of etching the sidewalls includes cyclically performing an isotropic etching process, a deposition process, and an anisotropic process.

16. A semiconductor package, comprising:

a die including a plurality of devices over a first substrate, wherein the first substrate includes a dopant at a first concentration, and wherein the first substrate has a first width along a horizontal direction; and a second substrate fused with the first substrate, wherein the second substrate includes the dopant at a second concentration greater than the first concentration, and wherein the second substrate has a second width along the horizontal direction, the second width being greater than the first width.

17. The semiconductor package of claim 16, wherein the plurality of devices includes at least one micro-electromechanical systems (MEMS) device.

18. The semiconductor package of claim 16, wherein the first substrate and the second substrate include the same semiconductor material.

19. The semiconductor package of claim 16, wherein the dopant includes boron, carbon, nitrogen, oxygen, sulfur, phosphorus, other dopants, or combinations thereof.

20. The semiconductor package of claim 16, wherein the first substrate includes a first semiconductor material having an orthorhombic crystal structure and the second substrate includes a second semiconductor material having a monoclinic crystal structure.

*    *    *    *    *